(12) United States Patent
Bi et al.

(10) Patent No.: US 10,727,352 B2
(45) Date of Patent: Jul. 28, 2020

(54) LONG-CHANNEL FIN FIELD EFFECT TRANSISTORS

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Peng Xu, Santa Clara, CA (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/881,179

(22) Filed: Jan. 26, 2018

(65) Prior Publication Data
US 2019/0237580 A1 Aug. 1, 2019

(51) Int. Cl.
*H01L 21/00* (2006.01)
*H01L 21/3065* (2006.01)
(Continued)

(52) U.S. Cl.
CPC ...... *H01L 29/7854* (2013.01); *H01L 21/3065* (2013.01); *H01L 27/1211* (2013.01);
(Continued)

(58) Field of Classification Search
CPC . H01L 29/161; H01L 29/0669; H01L 29/772; H01L 29/78; H01L 29/7853; H01L 29/7854; H01L 29/66795; H01L 29/66553; H01L 29/42392; H01L 29/1037; H01L 21/02694; H01L 21/02532; H01L 21/02606; H01L 21/30; H01L 21/302; H01L 21/3043; H01L 21/28562; H01L 21/306; H01L 21/30604; H01L 21/30608; H01L 21/3065; H01L 21/308; H01L 21/3145; H01L 21/3147; H01L 21/31604; H01L 21/318; H01L 21/3185; H01L 21/32; H01L 21/3205; H01L 21/3247; H01L 21/441; H01L 21/443; H01L 21/461; H01L 21/467; H01L 21/475; H01L 21/47573; H01L 21/6732; H01L 21/76205; H01L 21/76294; H01L 21/7621; H01L 21/823821; H01L 21/82385;
(Continued)

(56) References Cited

U.S. PATENT DOCUMENTS 6,753,216 B2 * 6/2004 Mathew ............ H01L 29/42384
257/E29.137
7,205,601 B2 4/2007 Lee et al.
(Continued)

*Primary Examiner* — Natalia A Gondarenko
(74) *Attorney, Agent, or Firm* — Tutunjian & Bitetto, P.C.; Vazken Alexanian

(57) ABSTRACT

A method of forming a long-channel fin field effect device is provided. The method includes forming a trench in a substrate, forming a pedestal in the trench, wherein the pedestal extends above the surface of the substrate, forming a sacrificial pillar on the pedestal, forming a rounded top surface on the sacrificial pillar to form a sacrificial support structure, forming a fin material layer on the exposed surface of the sacrificial support structure, and removing the sacrificial support structure to leave a free-standing inverted U-shaped fin.

15 Claims, 12 Drawing Sheets

(51) Int. Cl.
*H01L 29/10* (2006.01)
*H01L 29/66* (2006.01)
*H01L 29/78* (2006.01)
*H01L 29/423* (2006.01)
*H01L 27/12* (2006.01)

(52) U.S. Cl.
CPC .... *H01L 29/1037* (2013.01); *H01L 29/42392* (2013.01); *H01L 29/66553* (2013.01); *H01L 29/66666* (2013.01); *H01L 29/66795* (2013.01); *H01L 29/7827* (2013.01)

(58) Field of Classification Search
CPC ......... H01L 21/823878; H01L 27/1211; H01L 27/1288; H01L 27/1259; H01L 27/3262; H01L 27/3276; H01L 29/7869; H01L 29/45; H01L 29/518; H01L 29/78606; H01L 29/786; H01L 29/42384; H01L 29/4908; H01L 29/66969; H01L 29/78642; H01L 27/127; H01L 27/1203; H01L 27/1214; H01L 27/1248; H01L 27/1222; H01L 27/1225; H01L 27/1237; H01L 27/1251; H01L 27/1262; H01L 21/02554; H01L 21/0274; H01L 21/02565; H01L 21/47635
USPC ........ 257/401, 347; 438/427, 275, 424, 479, 438/151
See application file for complete search history.

(56) References Cited

U.S. PATENT DOCUMENTS

| | | | |
|---|---|---|---|
| 7,282,772 B2 | 10/2007 | Anderson et al. | |
| 7,326,634 B2* | 2/2008 | Lindert | H01L 29/66795 257/202 |
| 8,541,286 B2* | 9/2013 | Park | H01L 21/82343 257/E21.442 |
| 8,900,954 B2 | 12/2014 | Adkisson et al. | |
| 8,940,558 B2 | 1/2015 | Haensch et al. | |
| 9,054,044 B2* | 6/2015 | Flachowsky | H01L 21/3083 |
| 9,082,852 B1 | 7/2015 | Liu et al. | |
| 9,362,361 B1* | 6/2016 | Akarvardar | H01L 29/1054 |
| 9,537,011 B1 | 1/2017 | Cheng et al. | |
| 9,607,899 B1 | 3/2017 | Cheng et al. | |
| 2008/0283917 A1* | 11/2008 | Cheng | H01L 29/66795 257/347 |
| 2011/0210393 A1* | 9/2011 | Chen | H01L 21/82343 257/347 |
| 2013/0320453 A1* | 12/2013 | Pethe | H01L 29/7854 257/368 |
| 2014/0191335 A1* | 7/2014 | Yin | H01L 27/0886 257/401 |
| 2014/0273298 A1 | 9/2014 | Haensch et al. | |
| 2015/0037946 A1* | 2/2015 | Fumitake | H01L 29/808 438/231 |
| 2015/0162438 A1 | 6/2015 | Chou et al. | |
| 2017/0005012 A1 | 1/2017 | Liu et al. | |
| 2017/0200786 A1 | 7/2017 | Zang et al. | |
| 2017/0345840 A1* | 11/2017 | Su | H01L 21/30604 |
| 2018/0158957 A1* | 6/2018 | Rachmady | H01L 29/42392 |
| 2019/0214482 A1* | 7/2019 | Xie | H01L 29/66598 |

* cited by examiner

LONG-CHANNEL FIN FIELD EFFECT TRANSISTORS

BACKGROUND

Technical Field

The present invention generally relates to forming long-channel fin field effect transistors on a substrate, and more particularly to epitaxially growing an inverted U-shaped fin on a support structure to increase the device channel length.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a method of forming a long-channel fin field effect device is provided. The method includes forming a trench in a substrate, and forming a pedestal in the trench, wherein the pedestal extends above the surface of the substrate. The method further includes forming a sacrificial pillar on the pedestal. The method further includes forming a rounded top surface on the sacrificial pillar to form a sacrificial support structure. The method further includes forming a fin material layer on the exposed surface of the sacrificial support structure, and removing the sacrificial support structure to leave a free-standing inverted U-shaped fin.

In accordance with another embodiment of the present invention, a method of forming a long-channel fin field effect device is provided. The method includes forming two trenches in a substrate. The method further includes forming a pedestal in each of the trenches, wherein the pedestals each extend above the surface of the substrate. The method further includes forming a first sacrificial pillar on a first pedestal and a second sacrificial pillar on a second pedestal. The method further includes forming a protective liner on the first sacrificial pillar and the second sacrificial pillar. The method further includes removing an upper portion of the protective liner on each of the first sacrificial pillar and the second sacrificial pillar. The method further includes forming a rounded top surface on the first sacrificial pillar and the second sacrificial pillar to form a first sacrificial support structure and a second sacrificial support structure. The method further includes forming a fin material layer on the exposed surfaces of each of the first sacrificial support structure and a second sacrificial support structure, and removing the sacrificial support structure to leave a first inverted U-shaped fin and a second inverted U-shaped fin.

In accordance with yet another embodiment of the present invention, a long-channel fin field effect device is provided. The long-channel fin field effect device includes a dielectric pedestal on a substrate, wherein a portion of the dielectric pedestal extends above the surface of the substrate, and an inverted U-shaped fin on the substrate, wherein the inverted U-shaped fin is adjacent to the dielectric pedestal.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
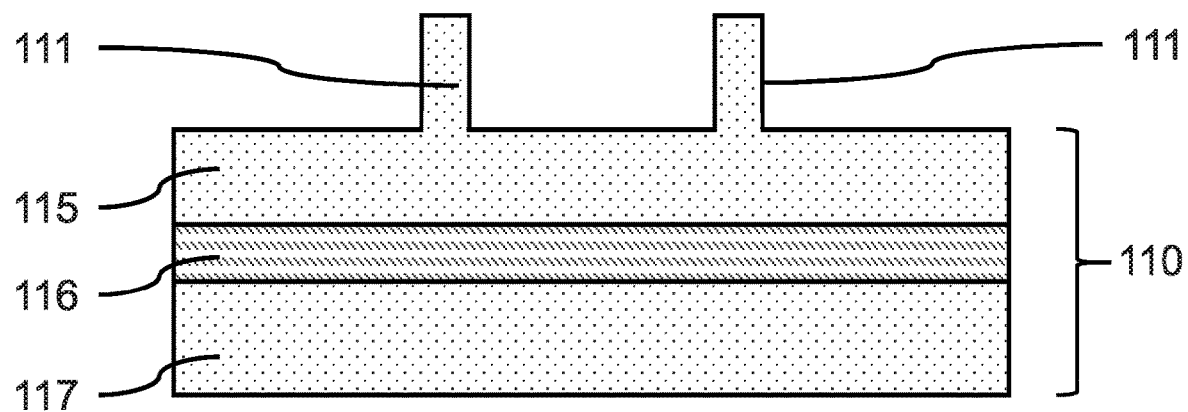
FIG. 1 is a cross-sectional side view showing a pair of vertical fins on a substrate including a carrier layer, an insulator layer, and an active layer, in accordance with an embodiment of the present invention.

Embodiments of the present invention relate generally to forming a long-channel fin field effect transistor by forming an inverted U-shaped fin on a support structure, where the support structure provides a surface for epitaxial growth of the fin. The long-channel fin field effect transistor has a channel length L that can be much greater than the sum of the drain and source depletion widths. The long-channel fin field effect transistor can have a width and a length where edge effects from the four sides can be neglected.

Embodiments of the present invention also relate generally to increasing the channel length of a vertical fin field effect device without increasing the overall height of the device beyond the capacity of present fabrication processes. Forming straight vertical fins on a substrate can involve multiple etchings and depositions that can become more complex and less accurate as the aspect ratio of the device features increase. By bending the fin channel into an inverted U-shape, increased channel lengths can be achieved without concomitant increases in aspect ratios. The length of the channel formed by the inverted U-shaped fin can be about two times the channel length of a vertical fin, where the inverted U-shaped fin can have two vertical legs and a connecting curved section.

Embodiments of the present invention also relate generally to utilizing standard FinFET patterning methods, configurations, and dimensions to provide a longer channel for enhanced input/output gate device (EG (I/O)) applications having a thicker gate dielectric layer. The support structure and inverted U-shaped fin can be formed along with standard FinFET device features on the substrate by incorporating support structure layers that can be patterned into device features with similar dimensions as other FinFET devices.

Embodiments of the present invention also relate generally to controlled atomic layer epitaxy to form an inverted U-shaped fin with a controlled channel thickness less than that achievable through vertical fin etching processes. Inverted U-shaped fins with a controlled channel thickness of about 3 nm to 5 nm can be achieved, which can provide drain-induced barrier lowering (DIBL) and threshold voltage benefits. All-around gates can also be formed on the inverted U-shaped fin. The $N_{Dfin}:P_{Dfin}$ is also tunable for design compatibility. Where the $D_{FIN}$, is a fin width, the $N_{Dfin}$ is the fin width of the NFET fin, and the $P_{Dfin}$ is the width of the PFET fin. The $N_{Dfin}:P_{Dfin}$ is the ratio of the NFET fin width to the PFET fin width.

Exemplary applications/uses to which the present invention can be applied include, but are not limited to: (EG (110)) devices and applications.

It is to be understood that aspects of the present invention will be described in terms of a given illustrative architecture; however, other architectures, structures, substrate materials and process features and steps can be varied within the scope of aspects of the present invention.

Referring now to the drawings in which like numerals represent the same or similar elements and initially to FIG. 1, a pair of vertical fins on a substrate including a support layer, an insulator layer, and an active layer is shown, in accordance with an embodiment of the present invention.

A substrate 110 can be, for example, a single crystal semiconductor material wafer or a semiconductor-on-insulator (SeOI) stacked wafer. The substrate can include a support layer 117 that provides structural support, and an active semiconductor layer 115 that can form devices. An insulating layer 116 may be between the active semiconductor layer and the support layer to form a semiconductor-on-insulator substrate (e.g., a silicon-on-insulator (SOI) substrate).

The support layer 117 can include crystalline, semi-crystalline, micro-crystalline, nano-crystalline, and/or amorphous phases. The support layer 117 can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g.

silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper (MoCu) composites, etc.), or combination thereof.

The active semiconductor layer 115 can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)). The active semiconductor layer 115 can be a single crystal semiconductor.

The insulating layer 116 can be, for example, a buried oxide (BOX) layer (e.g., $SiO_2$) or an implanted layer forming a buried insulating material.

In one or more embodiments, a plurality of vertical fins 111 can be formed on the substrate 110, where the vertical fins can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins 111 may be formed by a direct write process or double patterning process using, for example, immersion lithography, extreme ultraviolet lithography, or x-ray lithography. The vertical fins 111 can be formed from the active layer 115 by masking the fins and removing a portion of the active layer, where a portion of the active layer 115 can remain under the vertical fins 111.

In various embodiments, a fin template may be on each vertical fin 111, where the fin template can be formed during the patterning process. The fin templates can be a hardmask, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. A thin (i.e., <1 nm) oxide layer can be between the top surface of the vertical fin 111 and the fin template.

In various embodiments, the vertical fins 111 can be temporary fins that act as templates for forming other features on or in the substrate 110. The height, width, and length of the vertical fins 111 can be determined from the configuration and dimensions of the other features to be formed. The fin templates may be removed after forming the vertical fins 111.

In one or more embodiments, the vertical fins 111 can have a width in the range of about 5 nm to about 50 nm, or in the range of about 5 nm to about 15 nm, or in the range of about 10 nm to about 50 nm, or in the range of about 10 nm to about 15 nm, although other widths are contemplated.

In one or more embodiments, the vertical fins 111 can have a length in the range of about 20 nm to about 200 nm, or in the range of about 20 nm to about 100 nm, or in the range of about 20 nm to about 80 nm, although other lengths are contemplated.

In one or more embodiments, an adjacent pair of vertical fins 111 can be separated by a fin pitch in the range of about 15 nm to about 50 nm, or in the range of about 30 nm to about 100 nm, or in the range of about 15 nm to about 100 nm, although other fin pitches are also contemplated.

Figure 2:
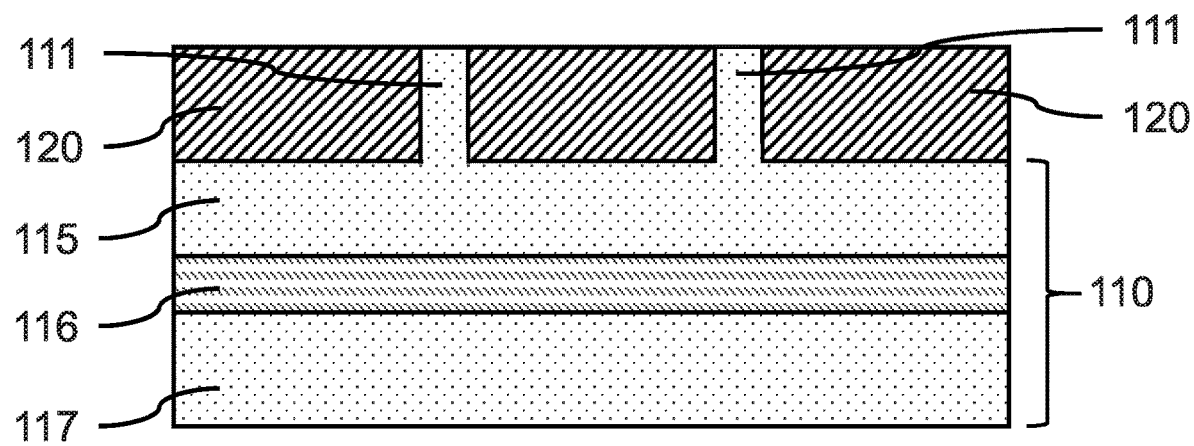
FIG. 2 is a cross-sectional side view showing a fill layer on the pair of vertical fins and surface of the active layer, in accordance with an embodiment of the present invention.

FIG. 2 is a cross-sectional side view showing a fill layer on the pair of vertical fins and surface of the active layer, in accordance with an embodiment of the present invention.

In one or more embodiments, a fill layer 120 can be formed on the vertical fins 111 and exposed surface of the active layer 115, where the fill layer 120 can be formed by a directional deposition, for example, a high density plasma chemical vapor deposition (HDPCVD), physical vapor deposition (PVD), or gas cluster ion beam (GCIB), or a blanket deposition and etch-back and/or chemical-mechanical polishing (CMP). In various embodiments, the top surfaces of the vertical fins 111 can be exposed after removing a portion of the fill layer 120 by CMP.

In one or more embodiments, a fill layer 120 can be made of an insulating, dielectric material, for example, silicon oxide (SiO), silicon nitride (SiN), a low-k dielectric material, or combinations thereof. A low-K dielectric can include amorphous carbon (a-C), fluorine doped silicon oxide (SiO:F), carbon doped silicon oxide (SiO:C), SiCOH, silicon boro carbonitride (SiBCN), or a combination thereof.

Figure 3:
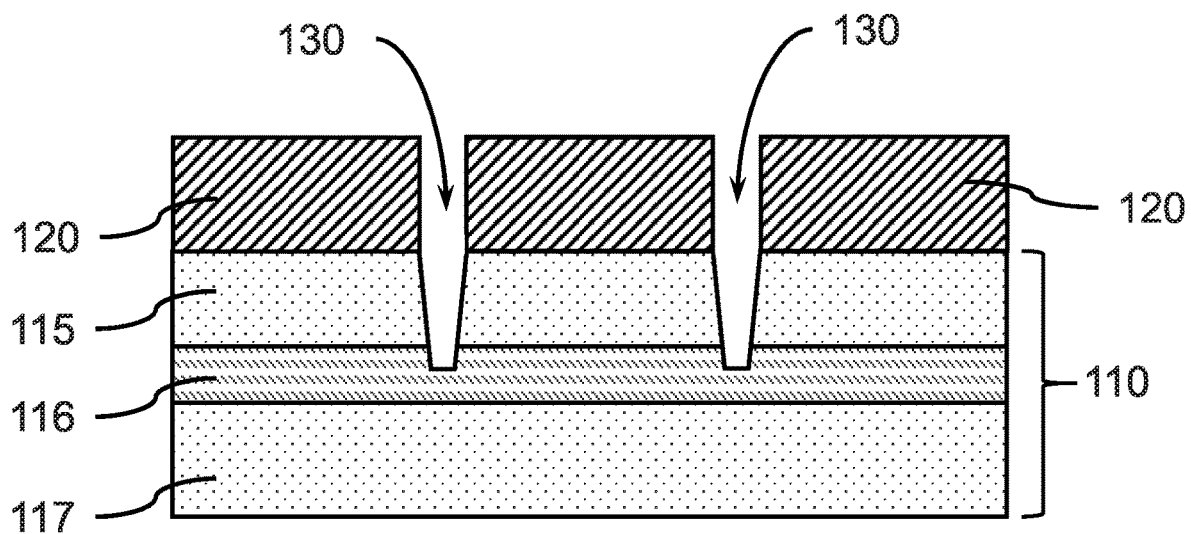
FIG. 3 is a cross-sectional side view showing two trenches formed through the fill layer and active layer into the insulator layer, where the trenches coincide with the positions of the vertical fins, in accordance with an embodiment of the present invention.

FIG. 3 is a cross-sectional side view showing two trenches formed through the fill layer and active layer into the insulator layer, where the trenches coincide with the positions of the vertical fins, in accordance with an embodiment of the present invention.

In one or more embodiments, the vertical fins 111 can be removed using a selective, directional etch, for example, a reactive ion etch (RIE), to form a trench 130 through the fill layer 120 and active layer 115 into the insulator layer 116. The fill layer 120 can act as a mask for the etching. The width and length of the vertical fins 111 can determine the width and length of the trenches 130 for subsequent formation of pedestals.

Figure 4:
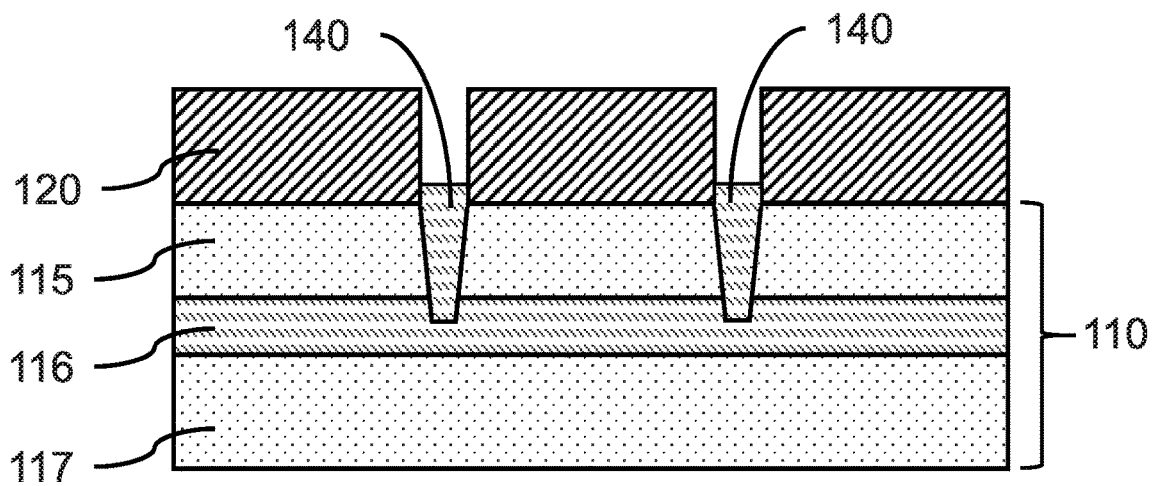
FIG. 4 is a cross-sectional side view showing a pedestal formed in each of the trenches in the active layer and the insulator layer, in accordance with an embodiment of the present invention.

FIG. 4 is a cross-sectional side view showing a pedestal formed in each of the trenches in the active layer and the insulator layer, in accordance with an embodiment of the present invention.

In one or more embodiments, a pedestal 140 can be formed in a lower portion of each of the trenches 130, where the pedestals 140 can be formed by a directional deposition on the surface of the fill layer 120 and into the trenches 130. In various embodiments, the directional deposition can be, for example, a high density plasma chemical vapor deposition (HDPCVD), physical vapor deposition (PVD), or gas cluster ion beam (GCIB), or a combination thereof. A blanket deposition with an etch-back and lift-off from the fill layer could also be used.

In various embodiments, the material of the pedestals 140 can be an insulating, dielectric material including, but not be limited to, silicon oxide (SiO), silicon nitride (SiN), a silicon oxynitride (SiON), a silicon carbonitride (SiCN), a silicon boronitride (SiBN), a silicon borocarbide (SiBC), a low-K dielectric, or combinations thereof. Other examples include, Applied Material's Black Diamond™. In a non-limiting exemplary embodiment, the pedestals 140 can be silicon dioxide ($SiO_2$) formed by a HDPCVD. The pedestals 140 can be formed to a predetermined height.

In various embodiments, the active semiconductor layer 115 can have a thickness in a range of about 50 nm to about 100 nm where the trenches can go through the active layer 115 to the underlying insulator layer 116. The trench segments in the active layer can have a tapering profile. The pedestals 140 can be formed in the trench segments in the active semiconductor layer 115 and insulator layer 116, where the pedestals 140 can extend above the surface of the active semiconductor layer 115. In various embodiments, the pedestals 140 can extend a height in the range of about 5 nm to about 15 nm above the surface of the active semiconductor layer 115, where the height above the surface can allow alignment of the bottom pedestal isolation height to a bottom source/drain region epitaxial layer. The top surface of a bottom source/drain region can be even with the bottom of an inner portion of a gate structure.

Figure 5:
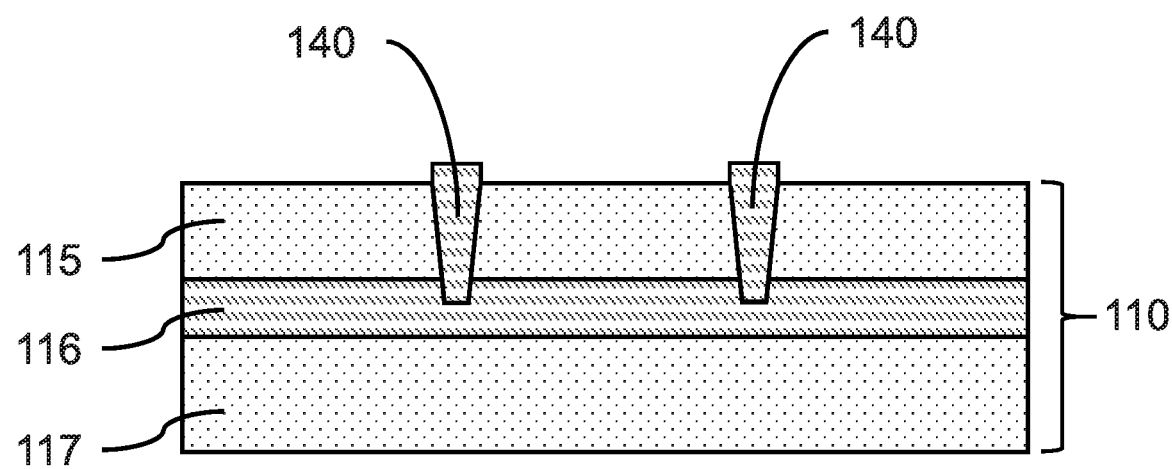
FIG. 5 is a cross-sectional side view showing a pedestal formed in each of the trench segments, in accordance with an embodiment of the present invention.

FIG. 5 is a cross-sectional side view showing a pedestal formed in each of the trench segments, in accordance with an embodiment of the present invention.

In one or more embodiments, the fill layer 120 can be removed using, for example, a selective wet or dry chemical etch. Removing the fill layer 120 can expose the surface of the active layer 115, and expose the portions of the pedestals 140 in the active layer 115 expending above the surface of the active layer. The pedestals 140 can electrically separate sections of the active layer.

Figure 6:
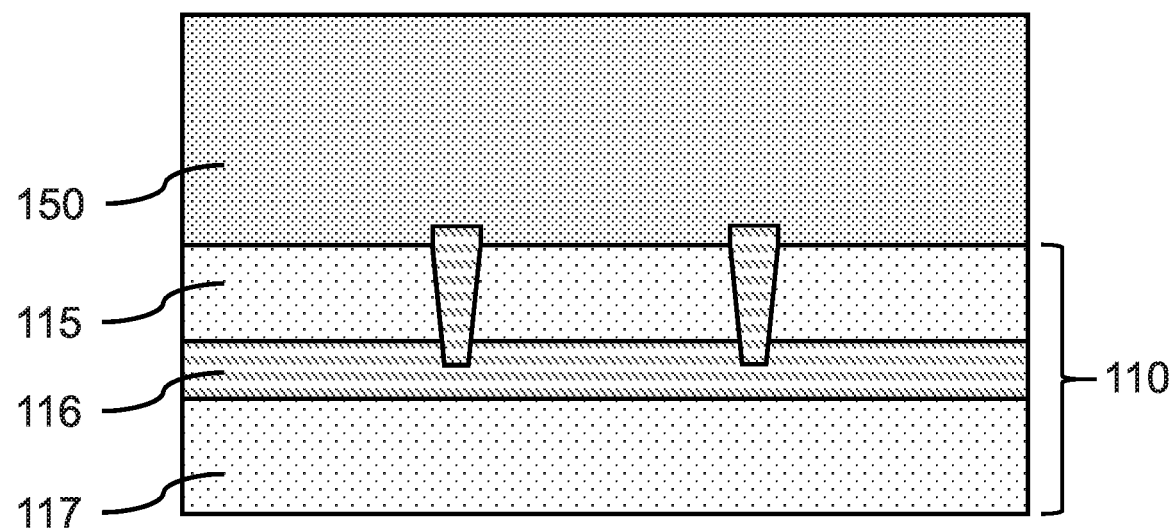
FIG. 6 is a cross-sectional side view showing a sacrificial template layer formed on the pedestals and the active layer, in accordance with an embodiment of the present invention.

FIG. 6 is a cross-sectional side view showing a sacrificial template layer formed on the pedestals and the active layer, in accordance with an embodiment of the present invention.

In one or more embodiments, a sacrificial template layer 150 can be formed on the pedestals 140 and the active layer 115, where the sacrificial template layer 150 can be formed by epitaxial growth on the active semiconductor layer 115. The sacrificial template layer 150 can be, for example, silicon carbide (SiC) or silicon-germanium (SiGe), where the active semiconductor layer 115 can be single crystal silicon (Si). In various embodiments, the sacrificial template layer 150 can be formed of a semiconductor material different from the active layer 115, where the sacrificial template layer 150 can be selectively etched relative to the active layer 115.

In one or more embodiments, the sacrificial template layer 150 can be formed to a height in the range of about 30 nm to about 200 nm, or in the range of about 50 nm to about 150 nm, or in the range of about 30 nm to about 100 nm, where the height of the sacrificial template layer 150 can determine the height of a subsequently formed sacrificial support structure.

Figure 7:
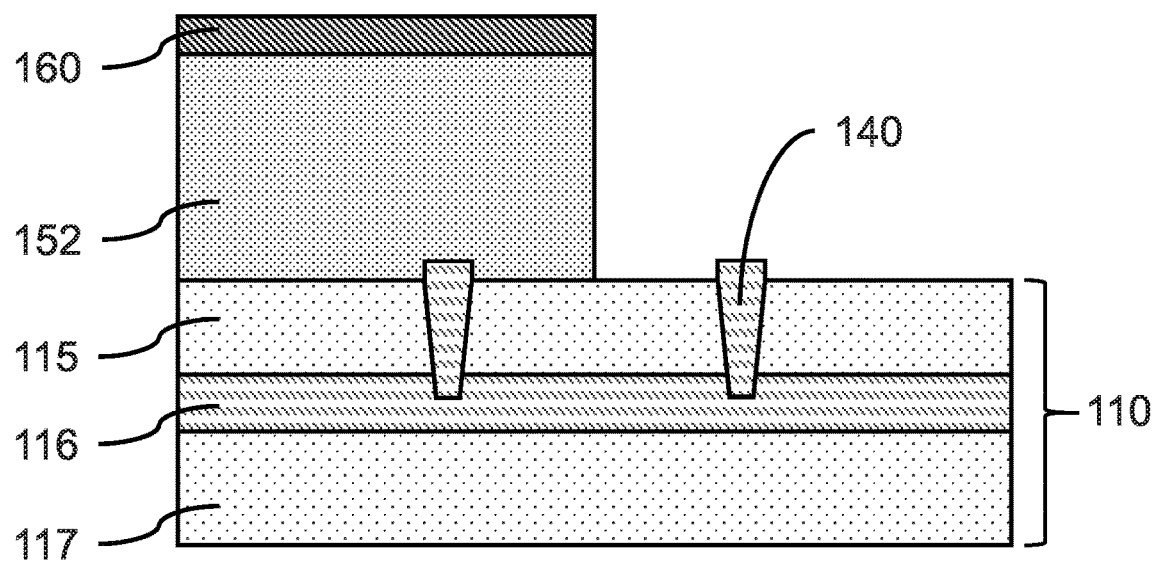
FIG. 7 is a cross-sectional side view showing the sacrificial template layer masked and patterned to form a first sacrificial template block, in accordance with an embodiment of the present invention.

FIG. 7 is a cross-sectional side view showing the sacrificial template layer masked and patterned to form a first sacrificial template block, in accordance with an embodiment of the present invention.

In one or more embodiments, a masking layer can be formed and patterned on the sacrificial template layer 150 to form a template mask 160, where the template mask 160 can be over a portion of the sacrificial template layer 150, substrate 110, and a pedestal 140. In various embodiments, the masking layer can be a softmask, a hardmask, or a combination thereof, formed by a blanket deposition. A soft mask material can be, for example, a lithography resist material, such as a polymeric material (e.g. poly(methyl methacrylate) (PMMA), siloxanes, polydimethylsiloxane (PDMS), hydrogen silsesquioxane (HSQ), tetraethyl orthosilicate (TEOS), etc.) or amorphous carbon (a-C). A hardmask material can be, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof.

In one or more embodiments, the exposed portion of the sacrificial template layer 150 can be removed to expose the surface of the active semiconductor layer 115 and a pedestal 140. The portion of the sacrificial template layer 150 can be removed using a selective, directional etch (e.g., RIE) to form a first sacrificial template block 152 on a portion of the substrate 110.

Figure 8:
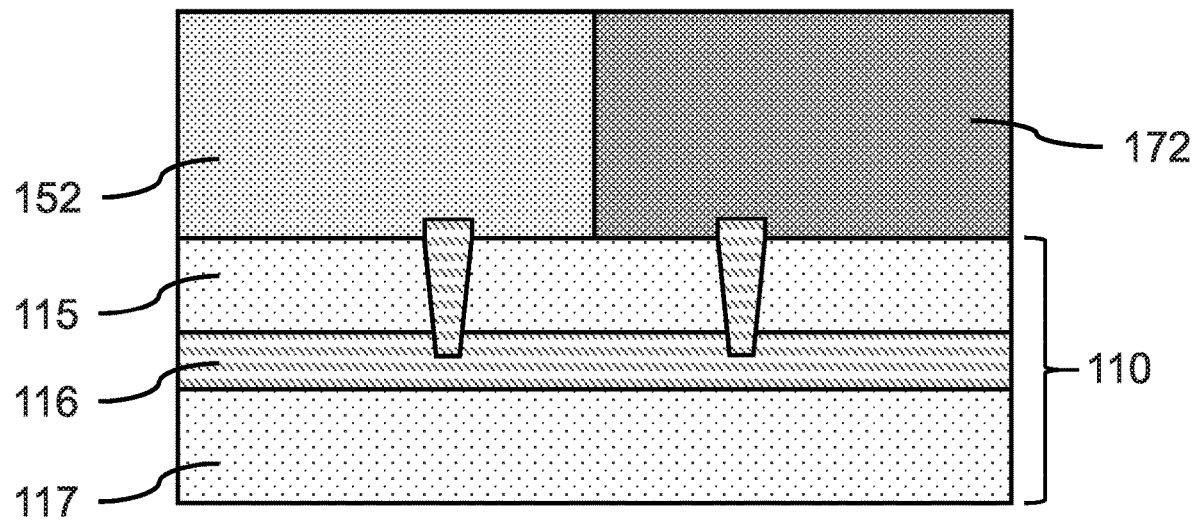
FIG. 8 is a cross-sectional side view showing a second sacrificial template block formed adjacent to the first sacrificial template block, in accordance with an embodiment of the present invention.

FIG. 8 is a cross-sectional side view showing a second sacrificial template block formed adjacent to the first sacrificial template block, in accordance with an embodiment of the present invention.

In one or more embodiments, a second sacrificial template block 172 can be formed adjacent to the first sacrificial template block 152, where the second sacrificial template block 172 can be formed by epitaxial growth on the exposed surface of the active layer 115. In various embodiments, the second sacrificial template block 172 can be formed of a semiconductor material different from the active layer 115 and the first sacrificial template block 152, where the second sacrificial template block 172 can be selectively etched relative to the active layer and the first sacrificial template block. The second sacrificial template block 172 can be, for example, silicon carbide (SiC) or silicon-germanium (SiGe), where the second sacrificial template block 172 can be the opposite material from the first sacrificial template block 152. In various embodiments, the template mask 160 can be removed, for example, by stripping, ashing, or CMP, and the first sacrificial template block 152 and second sacrificial template block 172 smoothed and polished using CMP to have uniform heights on the active layer 115.

In one or more embodiments, the second sacrificial template block 172 can be formed to a height in the range of about 30 nm to about 200 nm, or in the range of about 50 nm to about 150 nm, or in the range of about 30 nm to about 100 nm, where the height of the sacrificial template layer 150 can determine the height of a subsequently formed sacrificial support structure.

Figure 9:
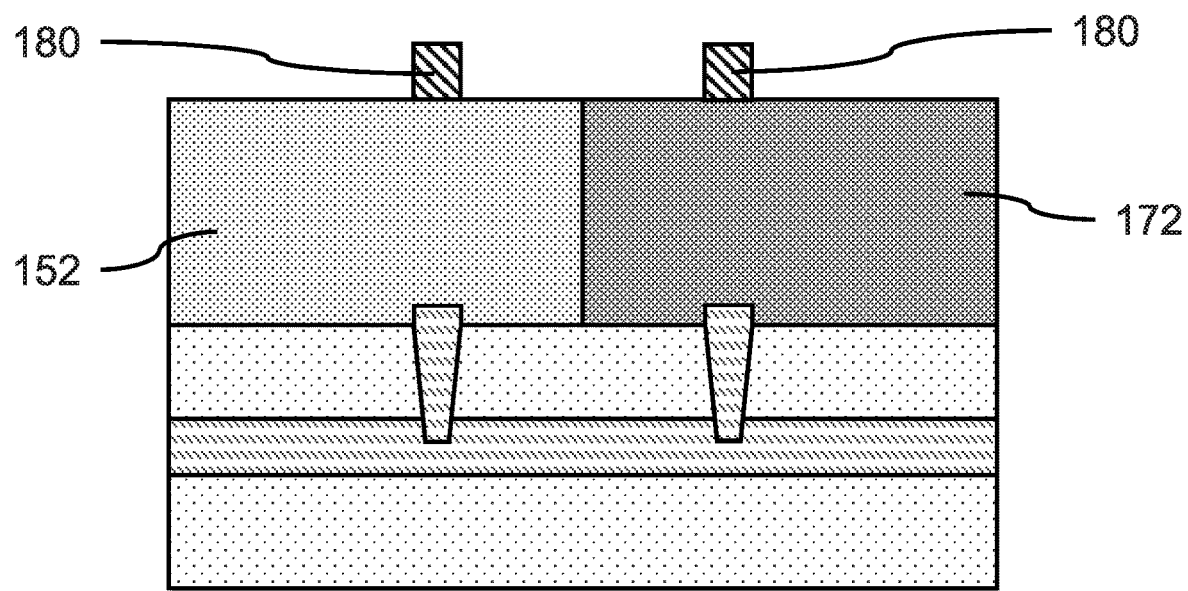
FIG. 9 is a cross-sectional side view showing a pair of support structure templates formed on the first and second sacrificial template blocks, where the support structure templates are aligned with the pedestals, in accordance with an embodiment of the present invention.

FIG. 9 is a cross-sectional side view showing a pair of support structure templates formed on the first and second sacrificial template blocks, where the support structure templates are aligned with the pedestals, in accordance with an embodiment of the present invention.

In one or more embodiments, one or more support structure templates 180 can be formed on each of the first sacrificial template block 152 and second sacrificial template block 172. The support structure templates 180 can be formed of a softmask, a hardmask, or combination thereof. The support structure templates 180 can be formed from a layer of a softmask and/or hardmask that is patterned and etched to be located above the pedestals 140, where the support structure templates 180 can be patterned using the same lithographic photomasks originally used to pattern the masks and templates for the vertical fins 111. Use of the same photomasks can minimize or avoid registration errors in forming the support structure templates 180 aligned with the pedestals 140.

Figure 10:
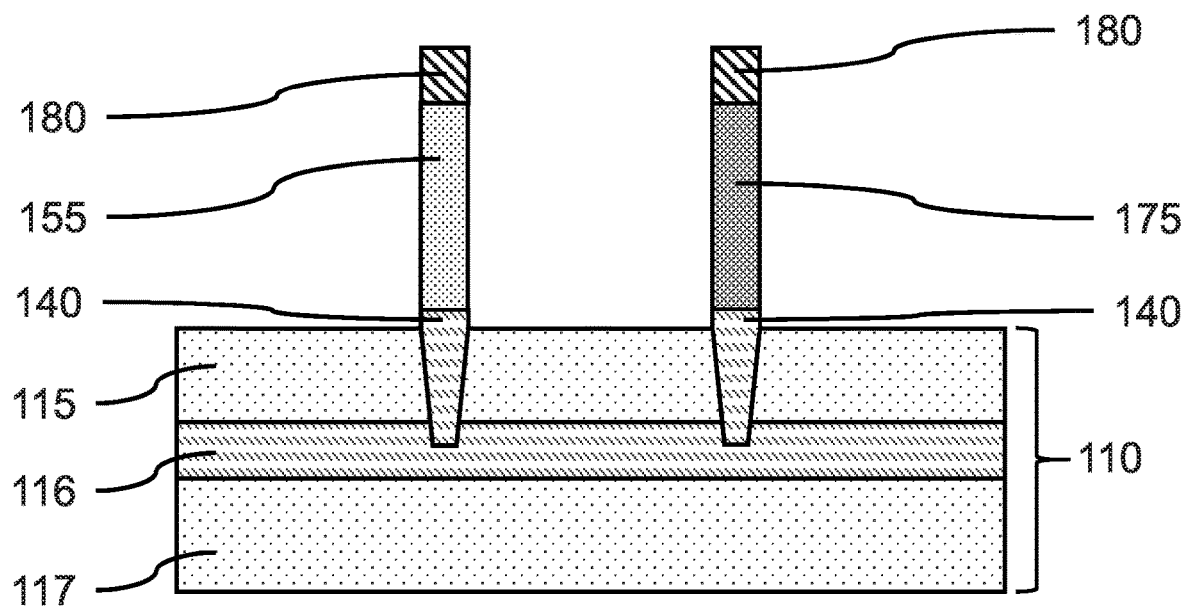
FIG. 10 is a cross-sectional side view showing a support structure template on each of a first sacrificial pillar and second sacrificial pillar, in accordance with an embodiment of the present invention.

FIG. 10 is a cross-sectional side view showing a support structure template on each of a first sacrificial pillar and second sacrificial pillar, in accordance with an embodiment of the present invention.

In one or more embodiments, sacrificial pillars 155, 175 can be formed from the sacrificial template blocks 152, 172 using a non-selective directional etch (e.g., physical/sputter etching), or sequential selective directional etching (e.g., RIE). The support structure templates 180 can cover the sacrificial pillars 155, 175, where each sacrificial pillar can be formed on a pedestal 140. In various embodiments, the sacrificial pillars 155, 175 can have the same width and length as the trenches 130 and subsequently formed pedestals 140, and a height equal to the first sacrificial template block 152 or second sacrificial template block 172. The first sacrificial pillar 155 can be a different material from the second sacrificial pillar 175.

Figure 11:
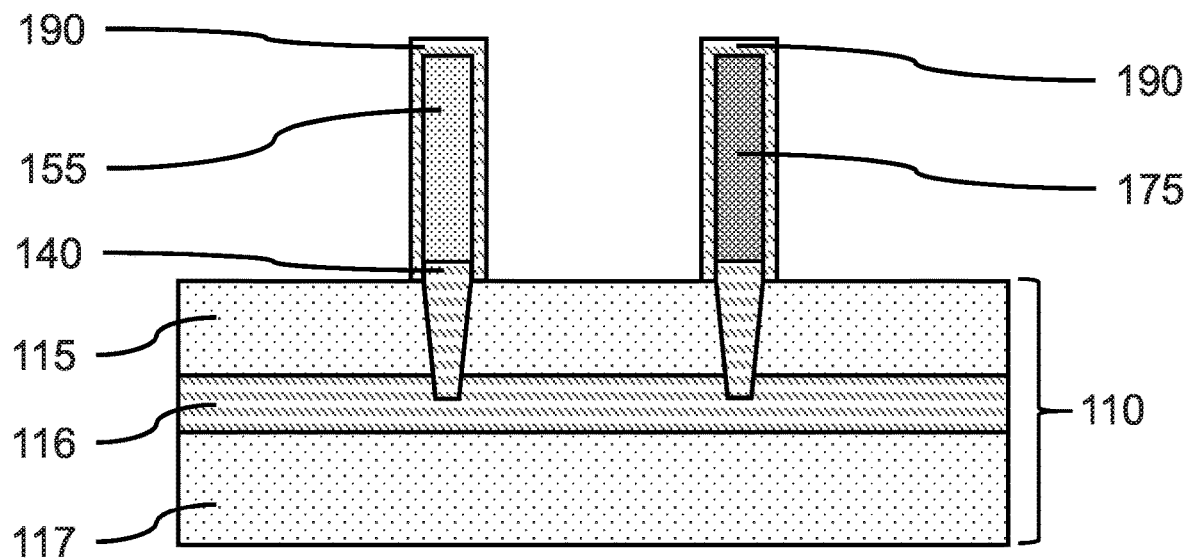
FIG. 11 is a cross-sectional side view showing a protective liner on each of the first and second sacrificial pillars, and a raised portion of the pedestals, in accordance with an embodiment of the present invention.

FIG. 11 is a cross-sectional side view showing a protective liner on each of the first and second sacrificial pillars, and a raised portion of the pedestals, in accordance with an embodiment of the present invention.

In various embodiments, the support structure templates 180 can be removed from the sacrificial pillars 155, 175, where the support structure templates 180 can be removed using a selective etch (e.g., wet or dry chemical etch).

In one or more embodiments, a protective liner 190 can be formed on each of the first and second sacrificial pillars 155, 175, and the portion of the pedestals 140 raised above the top surface of the active semiconductor layer 115. The protective liner 190 can be formed by a conformal deposition (e.g., atomic layer deposition (ALD), plasma enhanced ALD (PEALD)). The material of the protective liner 190 can be removed from the surface of the active layer 115 using a selective directional etch (e.g., plasma RIE).

In various embodiments, the protective liner 190 material can be, for example, silicon oxide (SiO), silicon nitride (SiN), a silicon oxynitride (SiON), a silicon carbonitride (SiCN), a silicon boronitride (SiBN), a silicon borocarbide (SiBC), a silicon oxycarbide (SiOC), a carbon-doped silica (SiO:C), a silicon boro carbonitride (SiBCN), a boron carbide (BC), a boron nitride (BN), or combinations thereof.

In various embodiments, the protective liner 190 can have a thickness in a range of about 3 nm to about 12 nm, or in a range of about 3 nm to about 10 nm, or in a range of about 5 nm to about 10 nm, or in a range of about 3 nm to about 7 nm, or in a range of about 3 nm to about 5 nm, where the thickness of the protective liner 190 can determine the thickness of a subsequently formed inverted U-shaped fin. Relatively thinner (i.e., <10 nm) channel thickness can reduce DIBL and provide threshold voltage, Vt, benefits.

Figure 12:
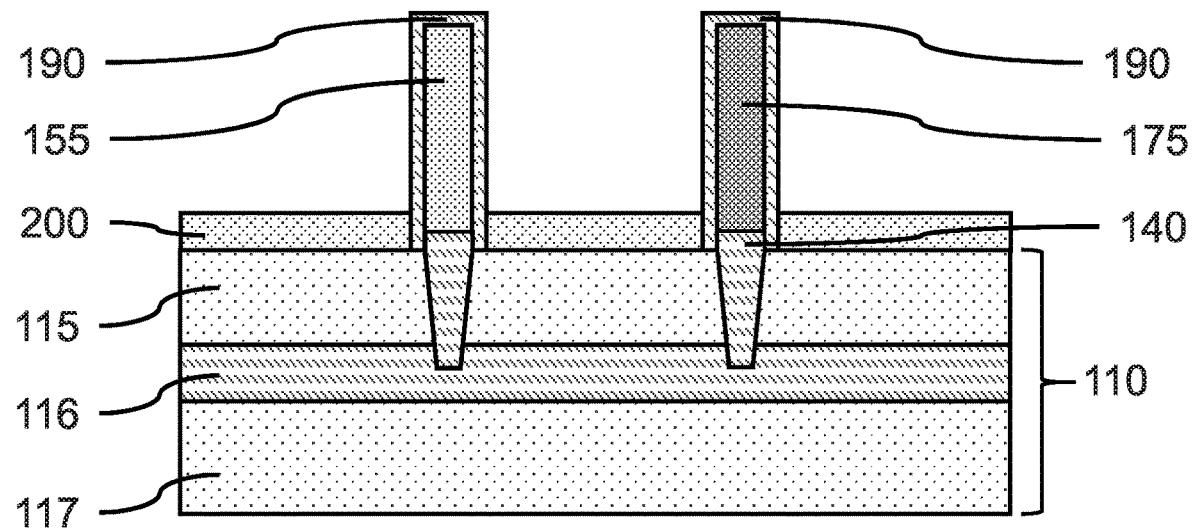
FIG. 12 is a cross-sectional side view showing a bottom source/drain region formed on the exposed surface of the active layer and adjacent to the protective liners, in accordance with an embodiment of the present invention.

FIG. 12 is a cross-sectional side view showing a bottom source/drain region formed on the exposed surface of the active layer and adjacent to the protective liners, in accordance with an embodiment of the present invention.

In one or more embodiments, a bottom source/drain region 200 can be formed on the exposed surface of the active layer 115 and adjacent to the protective liners 190, where the bottom source/drain region 200 can be formed by epitaxial growth on the active layer.

In various embodiments, the bottom source/drain region 200 can be in-situ doped (where doping and epitaxy growth are performed at the same time), and/or ex-situ doped (where doping occurs before and/or after epitaxy). Dopants (n-type or p-type) can be incorporated during epitaxy or by other suitable doping techniques, including but not limited to, ion implantation, gas phase doping, plasma doping, plasma immersion ion implantation, cluster doping, infusion doping, liquid phase doping, solid phase doping, etc. In various embodiments, the bottom source/drain region 200 can be doped to form n-type or p-type source/drains to fabricate NFETs or PFETs. In various embodiments, in-situ phosphorus doped silicon can be used as the bottom source/drain for NFETs and in-situ boron doped silicon germanium can be used as the bottom source/drain for PFETs.

In various embodiments, the bottom source/drain region 200 can have a thickness in the range of about 10 nm to about 50 nm, or in the range of about 10 nm to about 30 nm, or in the range of about 15 nm to about 50 nm, or in the range of about 30 nm to about 50 nm, or although other thicknesses are also contemplated.

In various embodiments, the bottom source/drain region 200 can cover a lower portion of the sidewalls of the protective liners 190, where the bottom edge of the protective liners 190 can be in contact with the active layer surface.

Figure 13:
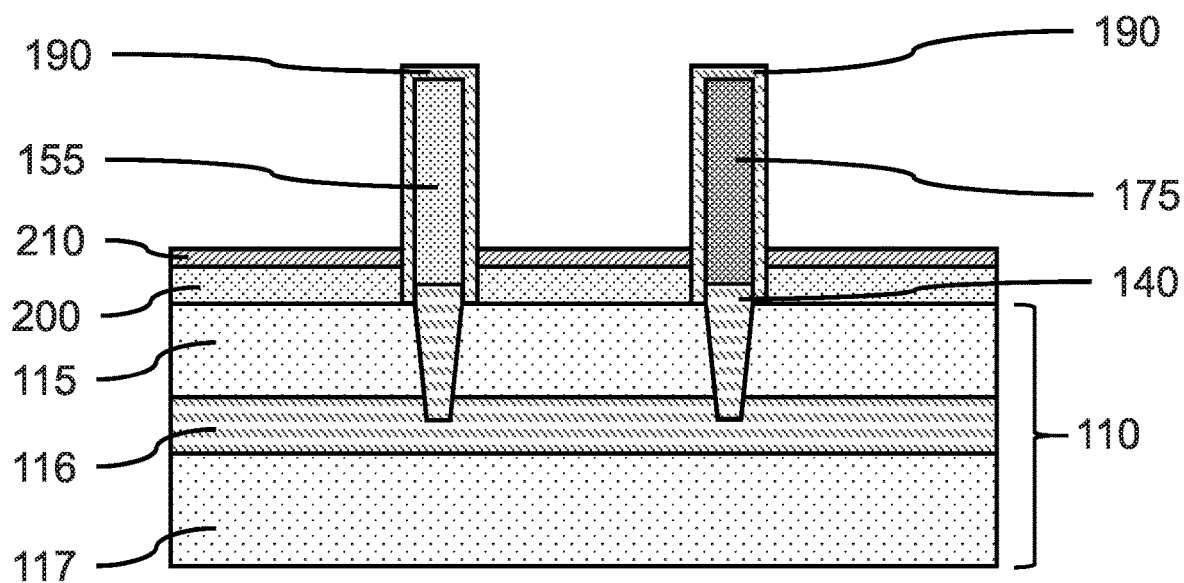
FIG. 13 is a cross-sectional side view showing a bottom spacer layer on the bottom source/drain region and adjacent to the protective liners, in accordance with an embodiment of the present invention.

FIG. 13 is a cross-sectional side view showing a bottom spacer layer on the bottom source/drain region and adjacent to the protective liners, in accordance with an embodiment of the present invention.

In one or more embodiments, a bottom spacer layer 210 can be formed on the bottom source/drain region 200 and adjacent to the protective liners 190, where the bottom spacer layer 210 can be formed by a directional deposition (e.g., HDPCVD, PVD, GCIB).

In one or more embodiments, the bottom spacer layer 210 can have a thickness in the range of about 1 nm to about 20 nm, or about 5 nm to about 20 nm, or about 1 nm to about 8 nm, or about 1 nm to about 5 nm, or about 2 nm to about 4 nm, although other thicknesses are contemplated.

In one or more embodiments, the bottom spacer layer 210 can be silicon oxide (SiO), silicon nitride (SiN), silicon oxynitride (SiON), silicon carbonitride (SiCN), silicon boronitride (SiBN), silicon borocarbide (SiBC), silicon oxycarbide (SiOC), silicon boro carbonitride (SiBCN), silicon oxy carbonitride (SiOCN), boron carbide (BC), boron nitride (BN), or combinations thereof. The bottom spacer layer 210 can be a different dielectric material from the protective liners 190, so the protective liners can be selectively removed.

Figure 14:
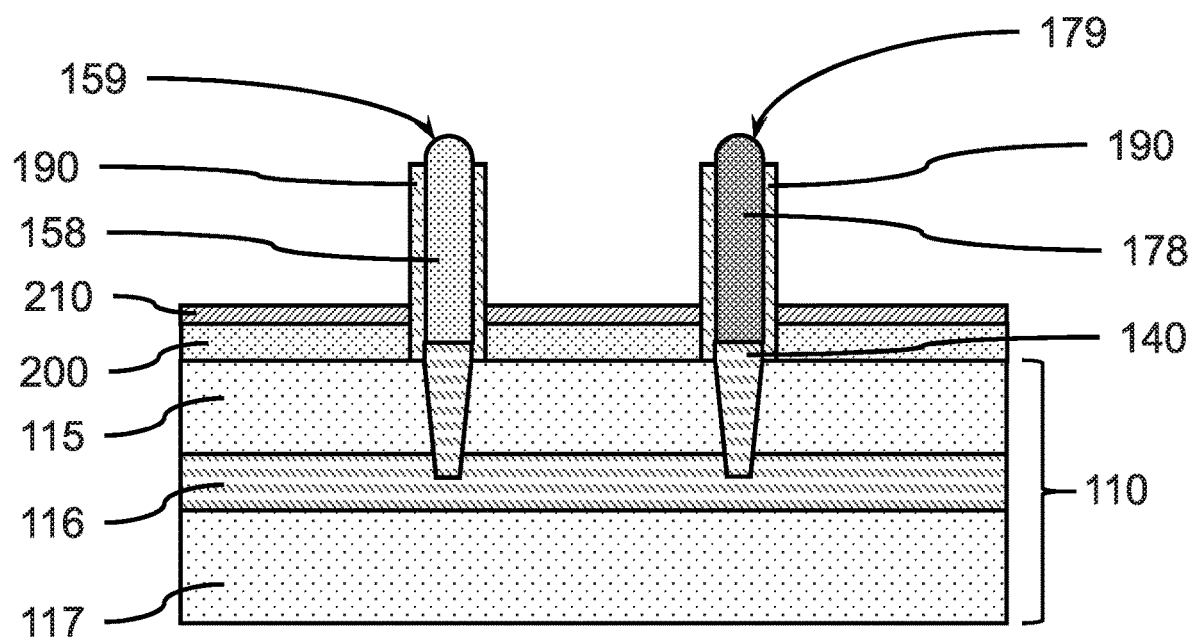
FIG. 14 is a cross-sectional side view showing the protective liners with a removed top portion and the first and second sacrificial pillars with rounded top surfaces to form sacrificial support structures, in accordance with an embodiment of the present invention.

FIG. 14 is a cross-sectional side view showing the protective liners with a removed top portion and the first and second sacrificial pillars with rounded top surfaces to form sacrificial support structures, in accordance with an embodiment of the present invention.

In one or more embodiments, the top surface of the protective liners 190 can be removed to expose the underlying first and second sacrificial pillars 155, 175, where the top surface of the protective liners 190 can be removed using a directional etch (e.g., RIE). The sidewalls of the protective liners 190 can be etched back to expose the sidewalls of the first and second sacrificial pillars 155, 175.

In various embodiments, the exposed material of the first and second sacrificial pillars 155, 175 can be etched to form a rounded top surface 159 of a first sacrificial support structure 158, and a rounded top surface 179 of a second sacrificial support structure 178, where the sacrificial support structures 158, 178 can be used to form inverted U-shaped fins. The first and second sacrificial pillars 155, 175 can be etched using a reactive ion plasma (RIP) etch process to obtain the rounded top surfaces 159, 179. The rounded top surfaces can reduced stress in a fin material layer.

Figure 15:
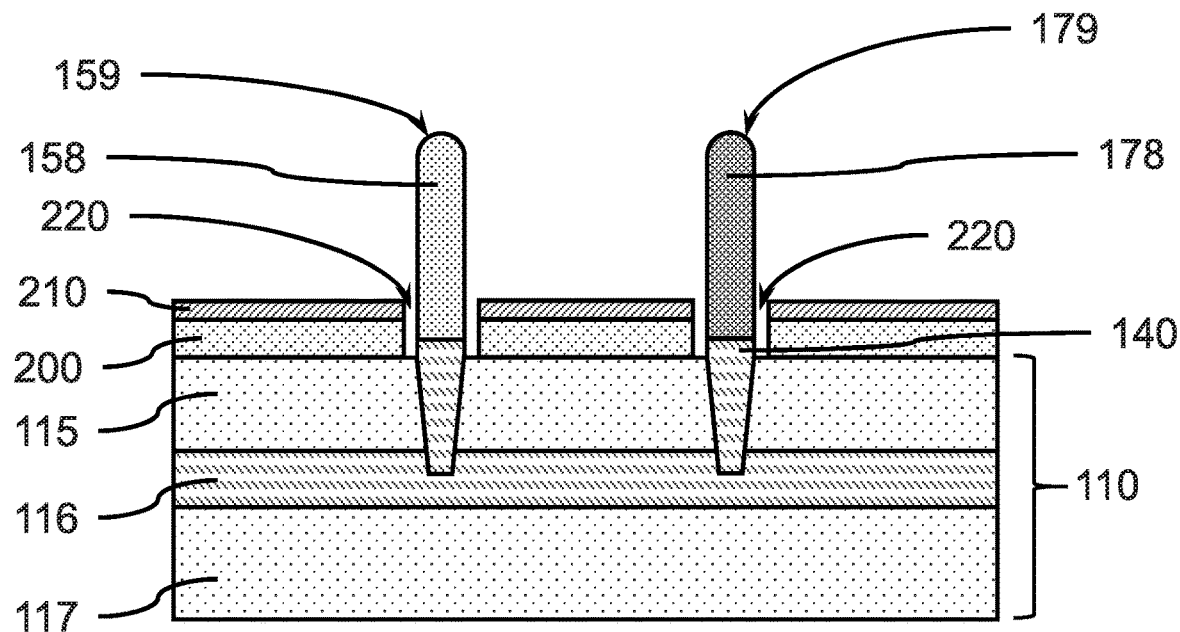
FIG. 15 is a cross-sectional side view showing an exposed first sacrificial support structure on a first pedestal and an exposed second sacrificial support structure on a second pedestal after removing the protective liners, in accordance with an embodiment of the present invention.

FIG. 15 is a cross-sectional side view showing an exposed first sacrificial support structure on a first pedestal and an exposed second sacrificial support structure on a second pedestal after removing the protective liners, in accordance with an embodiment of the present invention.

In one or more embodiments, the remaining portions of the protective liners 190 can be removed to expose the sidewalls of the first and second sacrificial support structures 158, 178, and a portion of the active layer 115 adjacent to the pedestals 140. The protective liners 190 can be removed using an isotropic, selective wet etch (e.g., wet chemical etch), where removal of the protective liners 190 can form growth channels 220 adjacent to the pedestals 140 and first and second sacrificial support structures 158, 178 that expose portions of the active layer 115. The growth channels 220 and exposed portions of the active layer 115 can have a width equal to the width of the protective liner 190.

Figure 16:
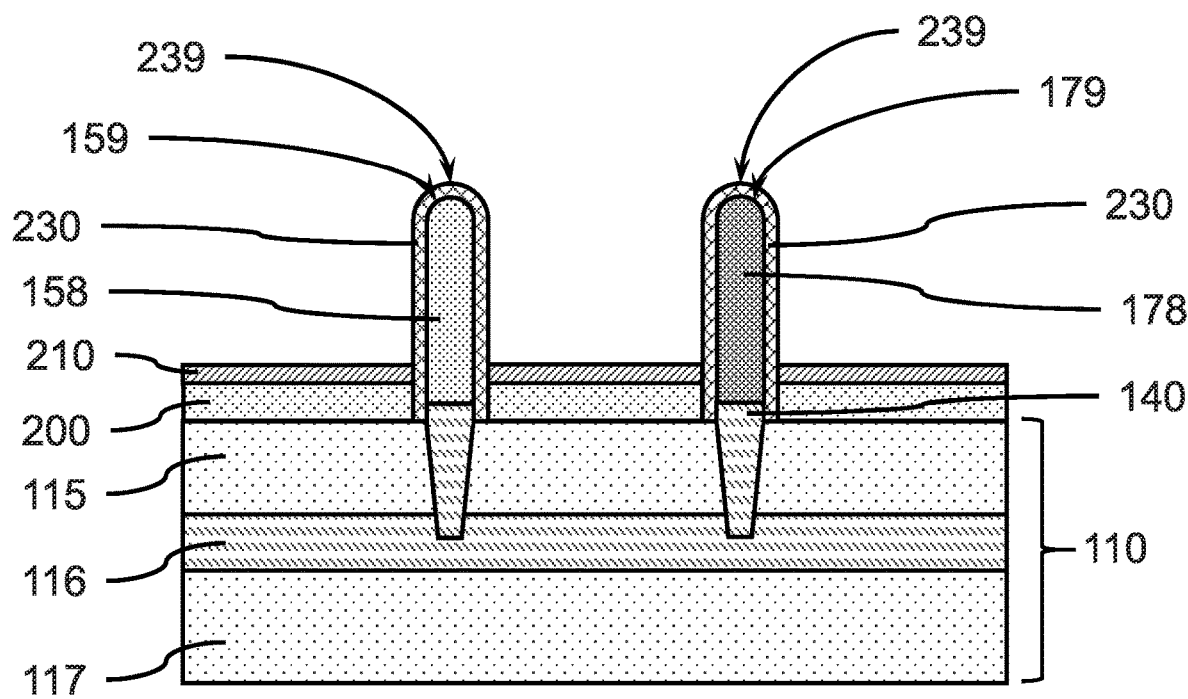
FIG. 16 is a cross-sectional side view showing an inverted U-shaped fin formed on each of the first and second sacrificial support structures, in accordance with an embodiment of the present invention.

FIG. 16 is a cross-sectional side view showing fin material layer formed on each of the first and second sacrificial support structures, in accordance with an embodiment of the present invention.

In one or more embodiments, fin material layer 230 can be formed on the first sacrificial support structure 158 on the first pedestal 140 and the second sacrificial support structure 178 on the second pedestal 140, where the fin material layer 230 can be formed by epitaxial growth on the exposed surfaces of the first and second sacrificial support structures 158, 178 and exposed portions of the active layer 115. The fin material layer 230 can be formed to a thickness equal to the width of the growth channels 220. The fin material layer 230 can be single crystal that is heteroepitaxially grown on the first sacrificial support structure 158 or the second sacrificial support structure 178, where the fin material layer 230 is different from the material of the first and second sacrificial support structures 158, 178. The fin material layers 230 can have curved surfaces 239 that are formed on the rounded surfaces 159, 179 of the first and second support structures 158, 178.

In various embodiments, the second sacrificial support structure 178 can be masked and a first fin material layer can be formed on the first sacrificial support structure 158, then the first sacrificial support structure 158 can be masked and a second fin material layer formed on the second sacrificial support structure 178, so the first fin material layer can be different from the second fin material layer. The fin material layer 230 can be a semiconductor material (e.g., IV semiconductor (e.g., Si), IV-IV semiconductor (e.g., SiGe), III-V semiconductor (e.g., GaAs), etc.) that can be formed on the support structures 158, 178. The thickness of the fin material layer 230 can be below a threshold at which dislocations may occur. The crystal lattice of the fin material layer 230 can have less than a 7% mismatch (<7%) to avoid formation of grain boundaries and dislocations. The carbon and germanium concentrations of the support structures 158, 178 may also be controlled.

Figure 17:
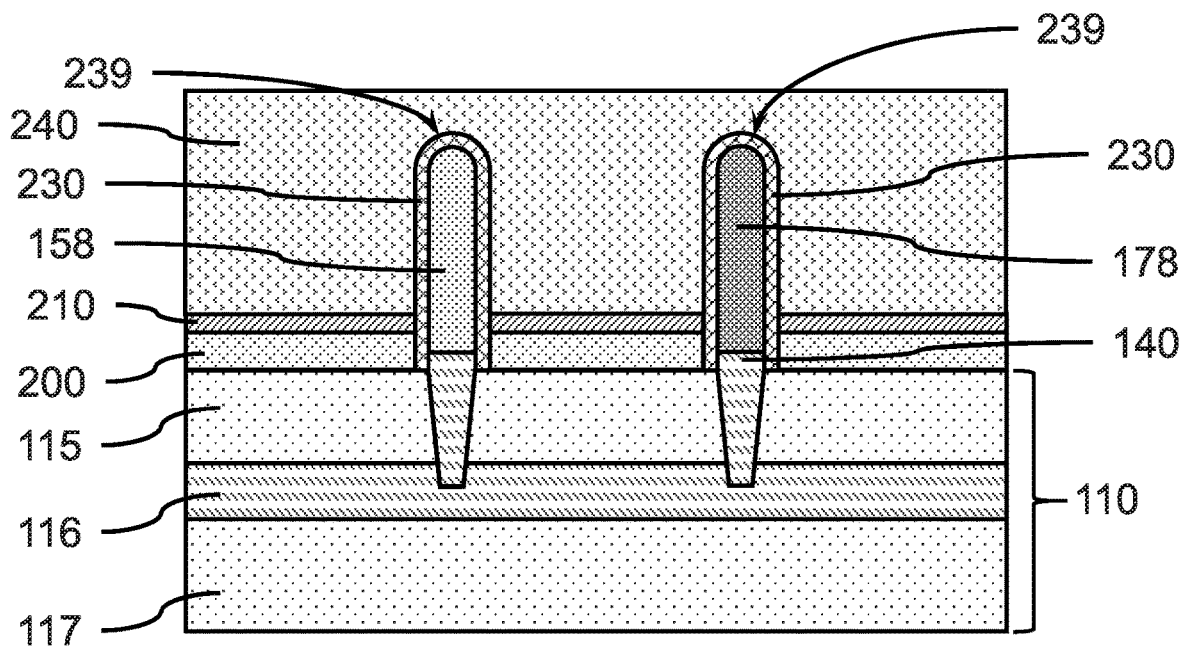
FIG. 17 is a cross-sectional side view showing a cover layer formed on the fin material layer and sacrificial support structures, in accordance with an embodiment of the present invention.

FIG. 17 is a cross-sectional side view showing a cover layer formed on the fin material layer and sacrificial support structures, in accordance with an embodiment of the present invention.

In one or more embodiments, a cover layer 240 can be formed on the fin material layer 230 and sacrificial support structures 158, 178, where the cover layer 240 can be formed by a blanket deposition (e.g., chemical vapor deposition (CVD), physical vapor deposition (PVD), spin-on). The cover layer 240 can be formed of a dielectric material selected from the group consisting of silicon oxide (SiO), a low-K insulating dielectric, silicon oxynitride (SiON), carbon doped silicon oxide (SiO:C), fluorine doped silicon oxide (SiO:F), boron carbon nitride (BCN), hydrogen silsesquioxane polymer (HSQ), methyl silsesquioxane polymer (MSQ), organosilicate glass (SiCOH), porous SiCOH, and combinations thereof. The cover layer 240 can undergo a CMP to provide a smooth, flat surface.

Figure 18:
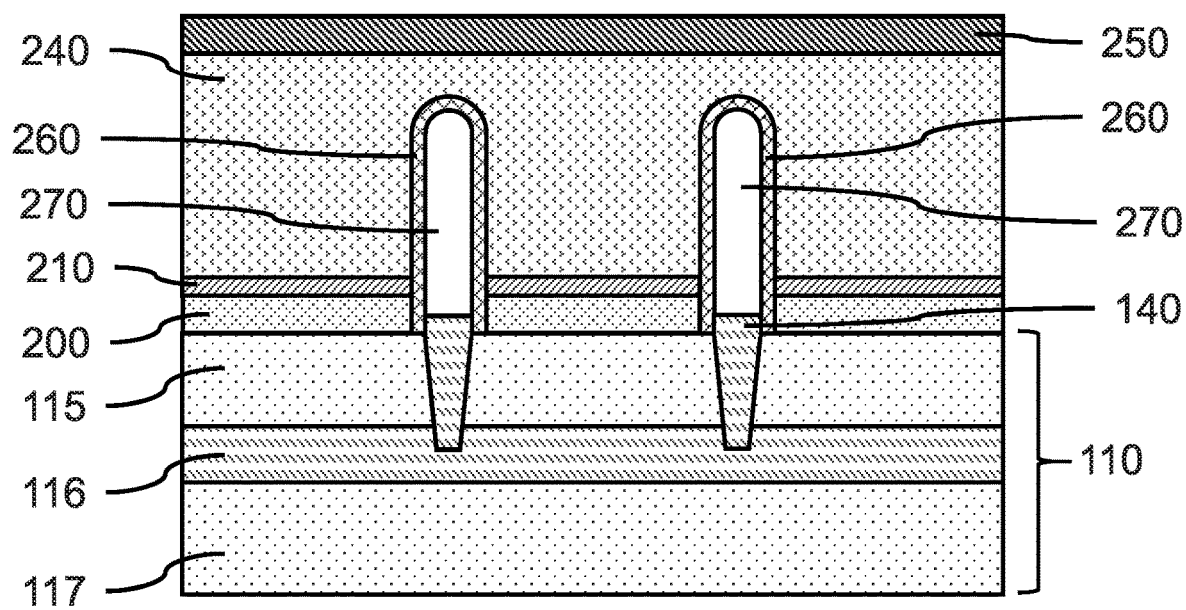
FIG. 18 is a cross-sectional side view showing the inverted U-shaped fins after removing the underlying sacrificial support structures, in accordance with an embodiment of the present invention.

FIG. 18 is a cross-sectional side view showing inverted U-shaped fins after removing the underlying sacrificial support structures, in accordance with an embodiment of the present invention.

In one or more embodiments, one or more cross-masks 250 can be formed on the cover layer 240, where the one or more cross-masks 250 can be formed by patterning and etching a softmask, hardmask, or combination thereof. The cross-masks 250 can be perpendicular to the fin material layer 230 and sacrificial support structures 158, 178. The cross-masks 250 can provide for sectioning the fin material layer 230 on the sacrificial support structures 158, 178 into multiple inverted U-shaped fins.

In one or more embodiments, a trough can be formed through the cover layer 240, fin material layer 230, and sacrificial support structures 158, 178 to partition the fin material layer 230, and sacrificial support structures 158, 178 into sections, where the end-faces of the sacrificial support structures 158, 178 are exposed in the troughs. The distance between the troughs can be predetermined to form inverted U-shaped fins with a predetermined fin width.

In various embodiments, the sacrificial support structures 158, 178 can be removed from beneath the fin material layer 230, where the sacrificial support structures 158, 178 can be removed using a selective isotropic etch (e.g., wet chemical etch) to leave inverted U-shaped fins 260 and a void space 270 below the inverted U-shaped fins 260.

In various embodiments, the inverted U-shaped fins 260 can have a width in a range of about 10 nm to about 100 nm, or in a range of about 20 nm to about 70 nm, or in a range of about 30 nm to about 50 nm, or in a range of about 10 nm to about 50 nm, or in a range of about 10 nm to about 20 nm, although other lengths are also contemplated.

In various embodiments, the inverted U-shaped fins 260 can have a thickness in a range of about 3 nm to about 12 nm, or in a range of about 3 nm to about 10 nm, or in a range of about 5 nm to about 10 nm, or in a range of about 3 nm to about 7 nm, or in a range of about 3 nm to about 5 nm, although other thicknesses are also contemplated.

Figure 19:
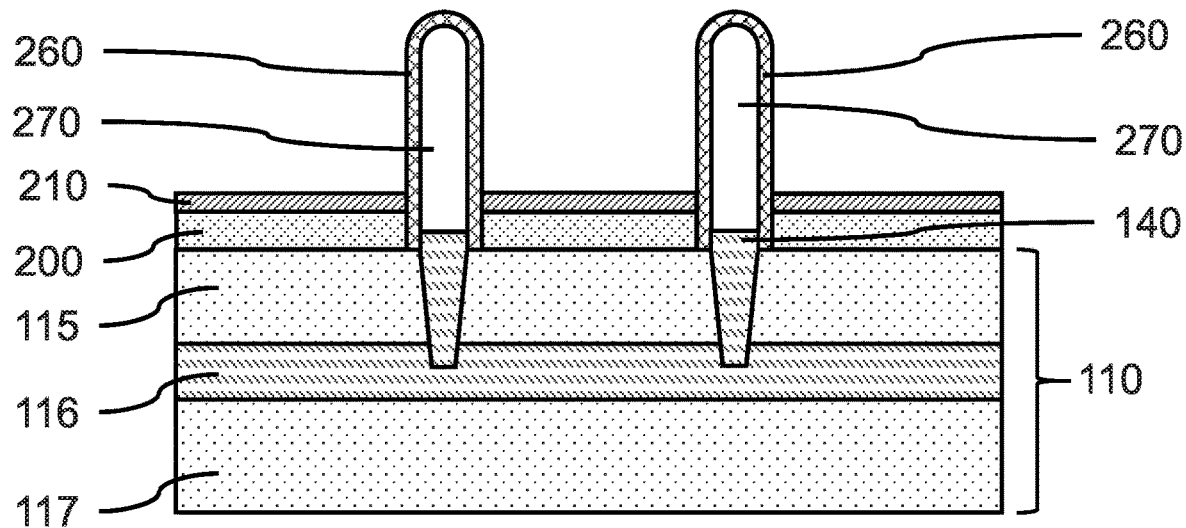
FIG. 19 is a cross-sectional side view showing the free-standing inverted U-shaped fins after removing the cover layer, in accordance with an embodiment of the present invention.

FIG. 19 is a cross-sectional side view showing the free-standing inverted U-shaped fins after removing the cover layer, in accordance with an embodiment of the present invention.

In one or more embodiments, the cross-masks 250 and cover layer 240 can be removed to leave free-standing inverted U-shaped fins 260 on the active semiconductor layer 115, where the legs of the inverted U-shaped fins 260 are separated by a dielectric pedestal 140 that electrically separates the legs of the inverted U-shaped fins 260. The legs of the inverted U-shaped fins 260 can each be in electrical contact with a portion of the bottom source/drain region 200. The pedestals 140 can separated the bottom source/drain region 200 into electrically separate bottom source/drain regions 200. The top surfaces of the bottom source/drain regions 200 can be above the top surfaces of the pedestals 140, and have a physical and electrical connection to the inverted U-shaped fins 260.

In various embodiments, the inverted U-shaped fins 260 can form a long device channel, where one leg of the inverted U-shaped fin is electrically connected to a source and the other leg of the inverted U-shaped fin is electrically connected to a drain.

Figure 20:
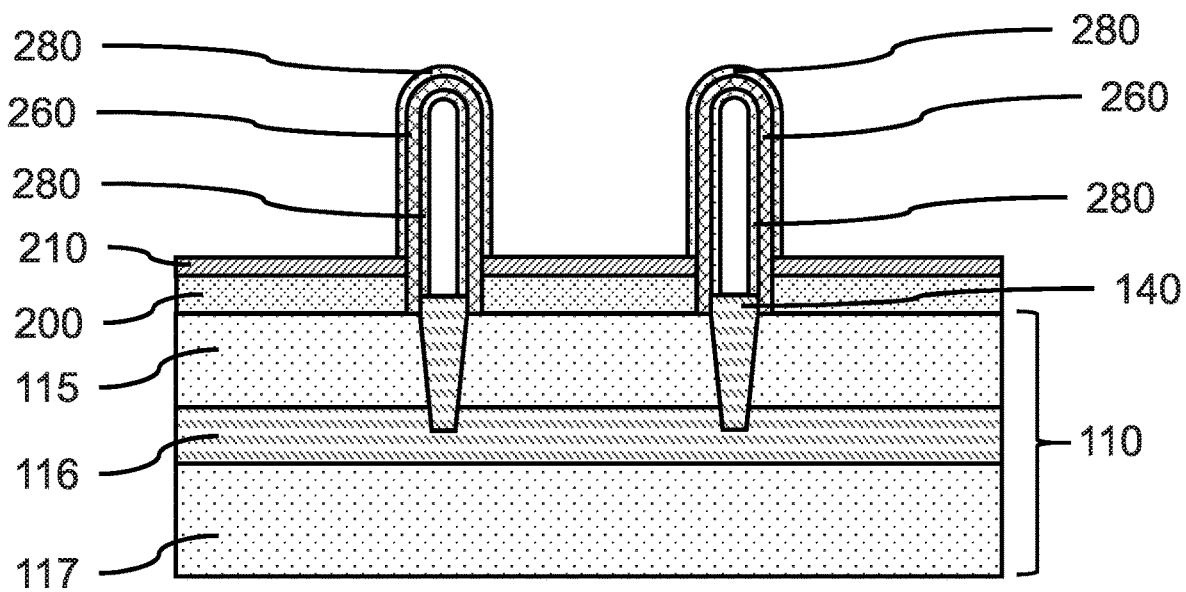
FIG. 20 is a cross-sectional side view showing all-around gate structures formed on each of the free-standing inverted U-shaped fins, in accordance with an embodiment of the present invention.

FIG. 20 is a cross-sectional side view showing all-around gate structures formed on each of the free-standing inverted U-shaped fins, in accordance with an embodiment of the present invention.

In one or more embodiments, a gate structure 280 can be formed on the inverted U-shaped fins 260, where the gate structure 280 can be an all-around gate structure formed on both the inside and outside surfaces of the inverted U-shaped fins 260. The gate structure 280 can include a gate dielectric layer, a work function material layer, and/or a gate metal layer.

In one or more embodiments, a gate dielectric layer can be formed on the inverted U-shaped fins 260, where the gate dielectric layer can be formed by a conformal deposition (e.g., ALD, PEALD).

In various embodiments, the gate dielectric layer can have a thickness in the range of about 1 nm to about 5 nm, or about 1 nm to about 3 nm, or about 2 nm.

In one or more embodiments, a gate dielectric layer can be silicon oxide (SiO), silicon nitride (SiN), silicon oxynitride (SiON), high-k dielectric materials, or a combination of these materials. Examples of high-k dielectric materials include, but are not limited to, metal oxides such as hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), and aluminum oxide (AlO). The high-k material can further include dopants such as lanthanum (La) and aluminum (Al).

In one or more embodiments, a work function layer can be formed on the gate dielectric layer, where the work function layer can be formed by a conformal deposition (e.g., ALD, PEALD).

In various embodiments, the work function layer can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

In one or more embodiments, a gate metal layer can be formed on the gate dielectric layer and work function layer, where the conductive gate fill layer can be formed by a conformal deposition (e.g., ALD, PEALD, CVD, PECVD).

In various embodiments, the gate metal layer can include doped polycrystalline silicon (p-Si) or amorphous silicon (a-Si), germanium (Ge), silicon-germanium (SiGe), a metal (e.g., tungsten, titanium, tantalum, ruthenium, zirconium, cobalt, copper, aluminum, lead, platinum, tin, silver, or gold), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), cobalt silicide (CoSi), nickel silicide (NiSi)), carbon nanotube(s) (CNTs), conductive carbon, graphene, or any suitable combination of these materials. The gate metal layer material can further include dopants that are incorporated during or after formation (e.g., deposition). In various embodiments, the work function layer can serve as a gate conductor without a gate metal layer.

Figure 21:
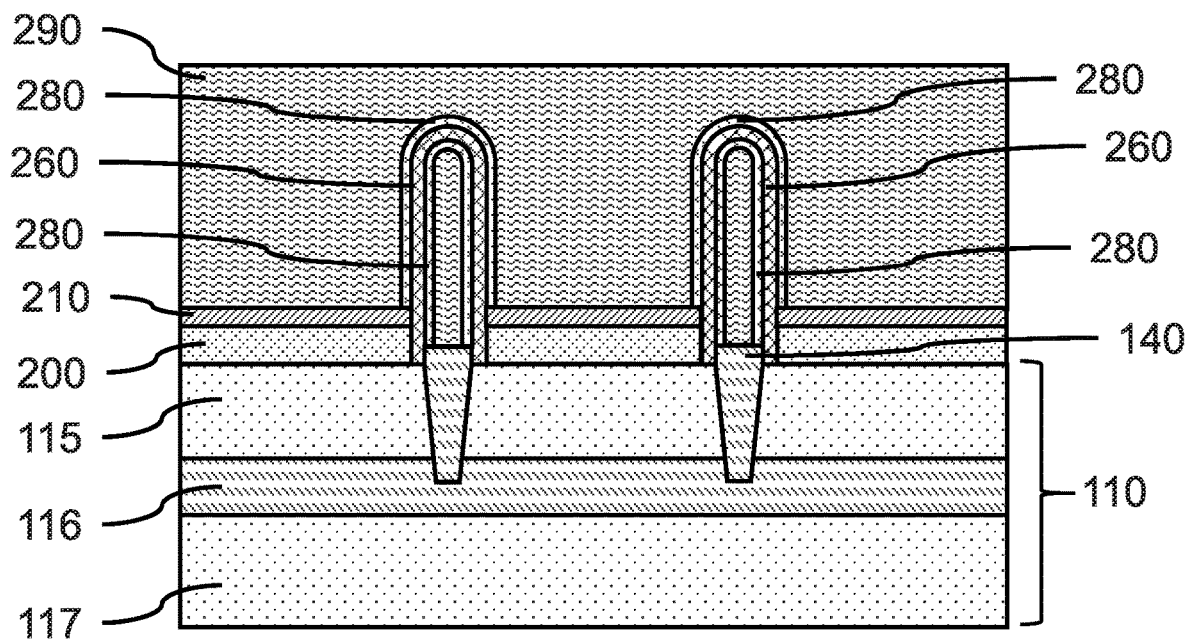
FIG. 21 is a cross-sectional side view showing an interlayer dielectric layer formed on the all-around gate structures and free-standing inverted U-shaped fins, in accordance with an embodiment of the present invention.

FIG. 21 is a cross-sectional side view showing an interlayer dielectric layer formed on the all-around gate structures and free-standing inverted U-shaped fins, in accordance with an embodiment of the present invention.

In one or more embodiments, an interlayer dielectric (ILD) layer 290 can be formed on the all-around gate structures 280 and free-standing inverted U-shaped fins 260. The ILD layer 290 can be formed of a dielectric material selected from the group consisting of silicon oxide (SiO), a low-K insulating dielectric, silicon oxynitride (SiON), carbon doped silicon oxide (SiO:C), fluorine doped silicon oxide (SiO:F), boron carbon nitride (BCN), hydrogen silsesquioxane polymer (HSQ), methyl silsesquioxane polymer (MSQ), organosilicate glass (SiCOH), porous SiCOH, and combinations thereof. The interlayer dielectric (ILD) layer 290 can be formed by a plasma enhanced chemical vapor deposition (PECVD) or by a flowable oxide to fill the void spaces 270, or a HDP to maintain the void spaces.

Figure 22:
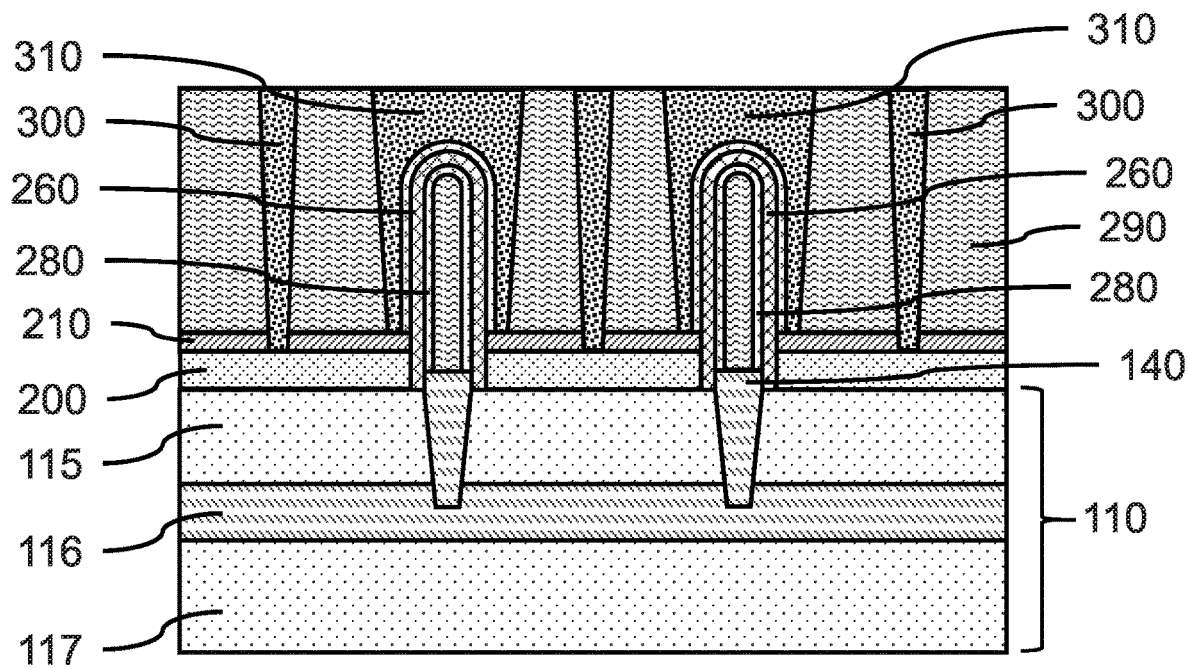
FIG. 22 is a cross-sectional side view showing electrical contacts formed to the gate structures, and bottom source/drain regions, in accordance with an embodiment of the present invention.

FIG. 22 is a cross-sectional side view showing electrical contacts formed to the gate structures, and bottom source/drain regions, in accordance with an embodiment of the present invention.

In one or more embodiments, a gate electrical contacts 310 can be formed to the gate structures 280, and source/drain electrical contacts 300 can be formed through the bottom spacer layer 210 to the bottom source/drain regions 200.

Figure 23:
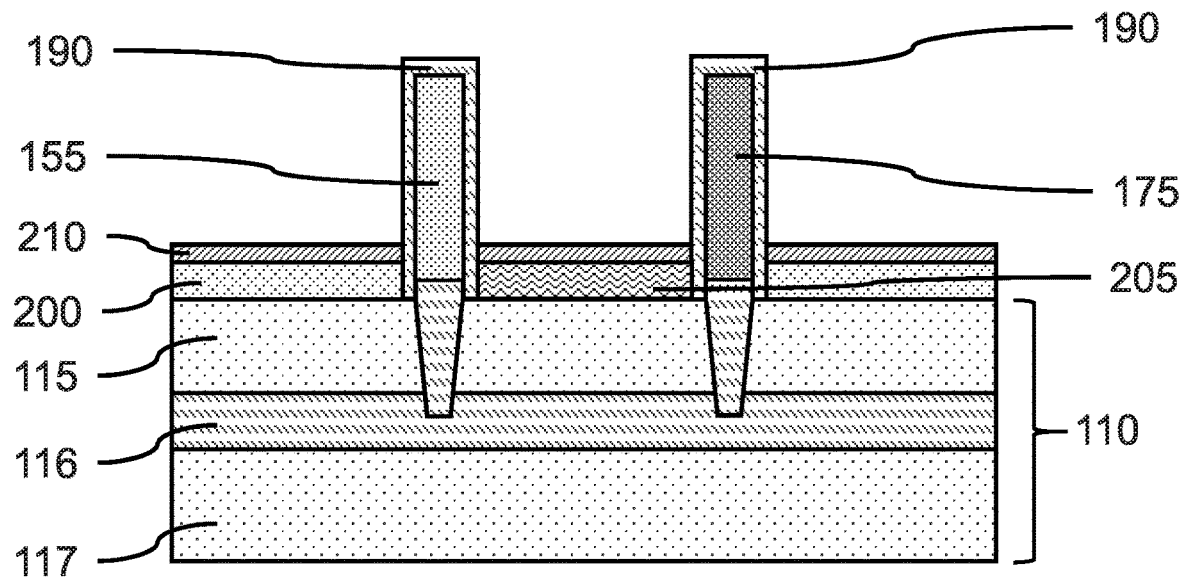
FIG. 23 is a cross-sectional side view showing an opposite polarity bottom source/drain region formed between the two protective liners and sacrificial pillars, in accordance with another embodiment of the present invention.

FIG. 23 is a cross-sectional side view showing an opposite polarity bottom source/drain region formed between the two protective liners and sacrificial pillars, in accordance with another embodiment of the present invention.

In one or more embodiments, opposite polarity bottom source/drain region 205 formed between the two protective liners 190 of adjacent sacrificial pillars 155, 175. In various embodiments, a portion of the bottom source/drain region 205 can be replaced with an insulating dielectric material to electrically isolate the two inverted U-shaped fins 260, where separate source/drain electrical contacts 320 can be formed to the adjacent inverted U-shaped fins 260.

Figure 24:
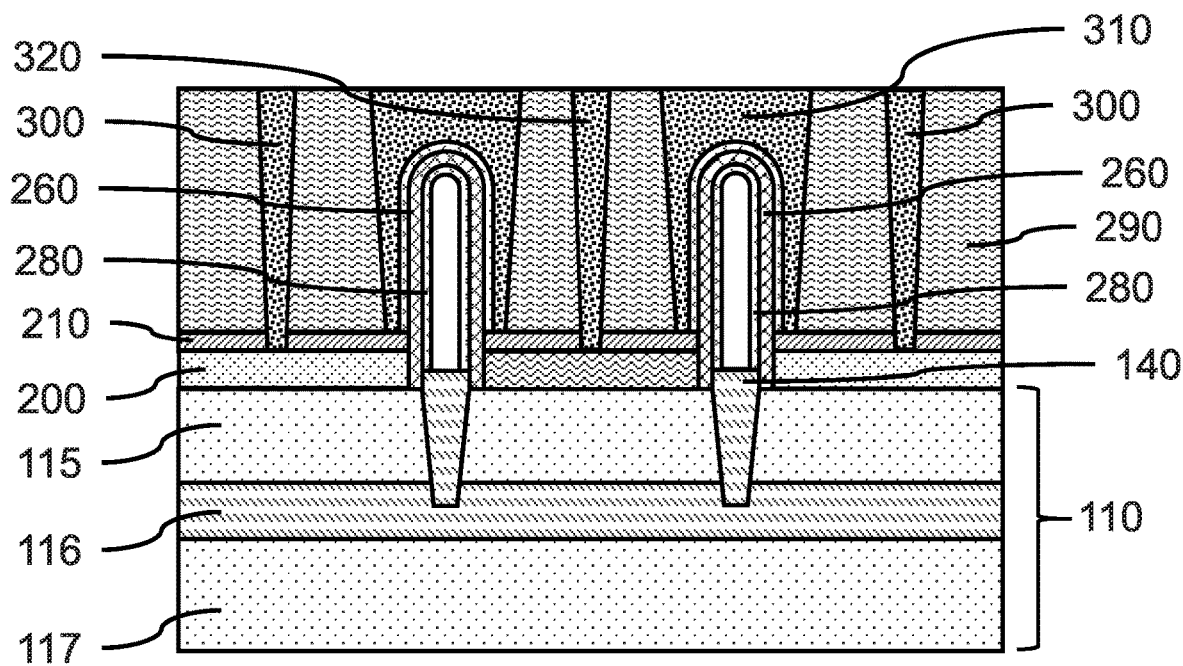
FIG. 24 is a cross-sectional side view showing electrical contacts formed to the gate structures, and bottom source/drain regions, in accordance with another embodiment of the present invention.

FIG. 24 is a cross-sectional side view showing electrical contacts formed to the gate structures, and bottom source/drain regions, in accordance with another embodiment of the present invention.

In one or more embodiments, gate electrical contacts 310 can be formed to the gate structures 280, and source/drain electrical contacts 300 can be formed through the bottom spacer layer 210 to the bottom source/drain regions 200. Source/drain electrical contacts 320 can be formed to the opposite polarity bottom source/drain region 205, or no electrical contact could be formed to the insulating dielectric material.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper." and the like, can be used herein for ease of description to describe one element's or feature's relationship to another element(s) or feature(s) as illustrated in the FIGS. It will be understood that the spatially relative terms encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a long-channel fin field effect device, comprising:
    forming a trench in a top surface of a substrate;
    forming a pedestal in the trench, wherein the pedestal extends above the top surface of the substrate;
    forming a sacrificial pillar on a top surface of the pedestal;
    forming a rounded top surface on the sacrificial pillar to form a sacrificial support structure, wherein the sacrificial support structure has an exposed surface;
    forming a fin material layer on the exposed surface of the sacrificial support structure; and
    removing the sacrificial support structure to leave a free-standing inverted U-shaped fin.

2. The method of claim 1, further comprising forming a protective liner on the sacrificial pillar, and a bottom source/drain region adjacent to the protective liner.

3. The method of claim 2, wherein the protective liner has a thickness in a range of about 3 nm to about 12 nm.

4. The method of claim 3, further comprising removing the protective liner to form a growth channel between the bottom source/drain region and sacrificial pillar.

5. The method of claim 4, wherein the fin material layer is formed by epitaxial growth on the surface of the sacrificial support structure and a surface of the substrate exposed by removing the protective liner.

6. The method of claim 5, further comprising forming an all-around gate structure on the inverted U-shaped fin.

7. The method of claim 6, wherein the sacrificial pillar is made of silicon carbide (SiC) or silicon-germanium (SiGe).

8. The method of claim 7, wherein the rounded top surface is formed on the sacrificial pillar using a reactive ion plasma (RIP) etch process.

9. The method of claim 7, wherein the substrate is a semiconductor-on-insulator substrate, and the pedestals are a dielectric material that extend to the insulating layer of the semiconductor-on-insulator substrate.

10. A method of forming a pair of long-channel fin field effect devices, comprising:

forming two trenches in a top surface of a substrate;

forming a pedestal in each of the trenches, wherein each pedestal extends above the top surface of the substrate;

forming a first sacrificial pillar on top of a first pedestal and a second sacrificial pillar on top of a second pedestal;

forming a protective liner on the first sacrificial pillar and the second sacrificial pillar;

removing an upper portion of the protective liner on each of the first sacrificial pillar and the second sacrificial pillar;

forming a rounded top surface on each of the first sacrificial pillar and the second sacrificial pillar to form a first sacrificial support structure and a second sacrificial support structure;

removing the protective liner remaining on each of the first sacrificial support structure and the second sacrificial support structure to expose the surfaces of each of the first sacrificial support structure and the second sacrificial support structure;

forming a fin material layer on the exposed surfaces of each of the first sacrificial support structure and the second sacrificial support structure; and removing each of the sacrificial support structures to leave a first inverted U-shaped fin and a second inverted U-shaped fin.

11. The method of claim 10, wherein the first sacrificial pillar is made of silicon carbide (SiC) or silicon-germanium (SiGe), and the second sacrificial pillar is made of the other of silicon carbide (SiC) or silicon-germanium (SiGe).

12. The method of claim 11, further comprising forming a bottom source/drain region adjacent to the protective liner, wherein the bottom source/drain region is doped to form n-type or p-type source/drains to fabricate NFETs or PFETs.

13. The method of claim 12, further comprising forming a bottom spacer layer on the bottom source/drain region, wherein the bottom spacer layer is adjacent to the protective liner.

14. The method of claim 13, wherein the protective liner has a thickness in a range of about 3 nm to about 12 nm.

15. The method of claim 14, wherein the pedestals are separated by a pitch in a range of about 15 nm to about 50 nm.

* * * * *